(12) United States Patent
Kim et al.

(10) Patent No.: US 8,872,216 B2
(45) Date of Patent: Oct. 28, 2014

(54) ORGANIC LIGHT EMITTING DEVICE AND METHOD FOR MANUFACTURING THE SAME

(75) Inventors: Sangdae Kim, Daegu (KR); Sunghoon Choi, Daegu (KR); Gwijeong Cho, Daegu (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/283,090

(22) Filed: Oct. 27, 2011

(65) Prior Publication Data

US 2012/0104451 A1   May 3, 2012

(30) Foreign Application Priority Data

Oct. 29, 2010   (KR) .................. 10-2010-0107040

(51) Int. Cl.
*H01L 51/00* (2006.01)
*H01L 51/50* (2006.01)
*H01L 51/56* (2006.01)
*H01L 51/52* (2006.01)

(52) U.S. Cl.
CPC ........ *H01L 51/5056* (2013.01); *H01L 51/0003* (2013.01); *H01L 51/56* (2013.01); *H01L 51/5012* (2013.01); *H01L 2251/556* (2013.01); *H01L 51/5016* (2013.01); *H01L 51/5237* (2013.01)
USPC ................. 257/99; 257/40; 313/504

(58) Field of Classification Search
CPC ............ H01L 51/5056; H01L 51/5068; H01L 51/5048; H01L 51/5024; H01L 33/62
USPC .................. 313/504; 257/40; 428/690
See application file for complete search history.

(56) References Cited

U.S. PATENT DOCUMENTS

| 6,297,588 | B1 | 10/2001 | Miyaguchi | |
|---|---|---|---|---|
| 6,825,061 | B2 * | 11/2004 | Hokari et al. | 438/99 |
| 2005/0012451 | A1 * | 1/2005 | Yuki et al. | 313/504 |
| 2007/0014916 | A1 * | 1/2007 | Daniels | 427/66 |
| 2008/0246395 | A1 * | 10/2008 | Nakai et al. | 313/504 |
| 2010/0176389 | A1 * | 7/2010 | Chun et al. | 257/40 |

FOREIGN PATENT DOCUMENTS

| JP | 2001068272 | 3/2001 | |
|---|---|---|---|
| KR | 2005-0104521 | * 11/2005 | 257/40 |

OTHER PUBLICATIONS

Extended European Search Report issued in corresponding European Patent Application No. 11186648.9, mailed Aug. 1, 2013, 10 pages.

* cited by examiner

*Primary Examiner* — Julia Slutsker
*Assistant Examiner* — Natalia Gondarenko
(74) *Attorney, Agent, or Firm* — Brinks Gilson & Lione

(57) ABSTRACT

An organic light emitting device and a method for manufacturing the same are provided. The organic light emitting device comprises: a substrate; a first electrode disposed on the substrate; a hole function layer disposed on the first electrode; a first emission layer disposed on the hole function layer; a second emission layer disposed on the first emission layer; an electron function layer disposed on the second emission layer; and a second electrode disposed on the electron function layer, wherein the hole function layer and the first emission layer are melted.

4 Claims, 2 Drawing Sheets

ORGANIC LIGHT EMITTING DEVICE AND METHOD FOR MANUFACTURING THE SAME

This application claims the benefit of Korean Patent Application No. 10-2010-0107040 filed on October 29, which is hereby incorporated by reference in its entirety.

BACKGROUND

1. Field

This document relates to an organic light emitting device and a method for manufacturing the same, and more particularly, to an organic light emitting device, which can improve interfacial characteristics between a first electrode and an organic layer or between organic layers, and a method for manufacturing the same.

2. Related Art

With the development of multimedia, a flat panel display (FPD) is recently becoming more important. In line with this trend, several flat type displays, such as a liquid crystal display (LCD), a plasma display panel (PDP), a field emitting display (FED), and an organic light emitting device, are being put to practical use.

In particular, the OLED is a self-emitting type which has a high-speed response speed (i.e., a response speed of 1 ms or less) and low consumption power. The OLED is also advantageous as a motion image display medium irrespective of the size of the device because it has no problem in the viewing angle. Further, the OLED is being in the spotlight as the next-generation FPD because the OLED can be fabricated at low temperature and has a simple manufacturing process based on the existing semiconductor process technology.

The OLED comprises a first electrode, a second electrode, and a light emitting layer disposed between the first electrode and the second electrode. Holes supplied from the first electrode and electrons supplied from the second electrode bond together in the light emitting layer to form excitons, and the OLED emits light due to energy generated when the excitons return to the bottom level.

However, materials used for the OLED, the stacked structures the OLED or the like have much influence on its lifespan and efficiency. Therefore, a study on the OLED is being actively progressed in order to develop an OLED having longer lifespan and better efficiency.

SUMMARY

An organic light emitting device comprises: a substrate; a first electrode disposed on the substrate; a hole function layer disposed on the first electrode; a first emission layer disposed on the hole function layer; a second emission layer disposed on the first emission layer; an electron function layer disposed on the second emission layer; and a second electrode disposed on the electron function layer, wherein the hole function layer and the first emission layer are melted.

A method for manufacturing an organic light emitting device comprises: forming a first electrode disposed on a substrate; forming a hole function layer on the first electrode; forming a first emission layer on the hole function layer; melting the hole function layer and the first emission layer; forming a second emission layer on the first emission layer; forming an electron function layer on the second emission layer; and forming a second electrode on the electron function layer.

BRIEF DESCRIPTION OF THE DRAWINGS

The accompany drawings, which are included to provide a further understanding of the invention and are incorporated on and constitute a part of this specification illustrate embodiments of the invention and together with the description serve to explain the principles of the invention.

DETAILED DESCRIPTION

Reference will now be made in detail embodiments of the invention examples of which are illustrated in the accompanying drawings.

Figure 1:
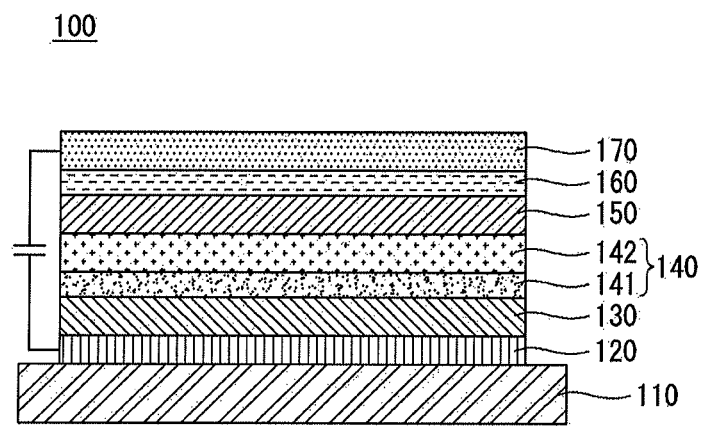
FIG. 1 is a view showing an organic light emitting device according to an exemplary embodiment of the present invention.

FIG. 1 is a view showing an organic light emitting device according to an exemplary embodiment of the present invention.

Referring to FIG. 1, the organic light emitting device 100 according to an exemplary embodiment of the present invention comprises a substrate 110, a first electrode 120, a hole function layer 130, an emission layer 140 comprising a first emission layer 141 and a second emission layer 142, an electron transportation layer 150, an electron injection layer 160, and a second electrode 170.

The substrate 110 may be made of glass, plastic, or metal, and may further comprise a thin film transistor comprising a semiconductor layer, a gate electrode, a source electrode, and a drain electrode.

The first electrode 120 may be transparent or reflective. If the first electrode 120 is transparent, it may be made of any one of indium tin oxide (ITO), indium zinc oxide (IZO), and zinc oxide (ZnO).

If the first electrode 120 is reflective, it may further comprise a reflection layer, made of any one of aluminum (Al), silver (Ag), and nickel (Ni), placed under a layer made of any one of ITO, IZO and, ZnO, or further may comprise a reflection layer interposed between two layers made of any one of ITO, IZO and ZnO.

The hole function layer 130 functions to make smooth the injection and transportation of holes from the first electrode 120 to the emission layer 140, and may comprise a hole injection layer and a hole transportation layer.

The hole injection layer may be made of at least one selected from the group consisting of CuPC (cupper phthalocyanine), PEDOT (poly(3,4)-ethylenedioxythiophene), PANI (polyaniline), and NPD (N,N-dinaphthyl-N,N'-diphenyl benzidine), but not limited thereto.

The hole transportation layer may be made of at least one selected from the group consisting of NPD (N,N-dinaphthyl-N,N'-diphenyl benzidine), TPD (N,N'-bis-(3-methylphenyl)-N,N'-bis-(phenyl)-benzidine), s-TAD and MTDATA (4,4',4"-Tris(N-3-methylphenyl-N-phenyl-amino)-triphenylamine), but not limited thereto.

The emission layer 140 may comprise a first emission layer 141 and a second emission layer 142.

The first emission layer 141 is a layer contacting the hole function layer 130, and may comprise a single host material. The host material is determined according to the light emission color of the second emission layer 142, which will be described below.

The second emission layer 142 disposed on the first emission layer 141 may comprise a host and a dopant. The second emission layer 142 may comprise a region comprising a light emitting dopant for directly emitting light.

The second emission layer 142 may be made of a material emitting light of any one of red, green, and blue, or of a phosphorescent material or a fluorescent material.

If the second emission layer 142 is a red light emitting layer, it may be made of a phosphorescent material which comprises a host material comprising CBP (carbazole biphenyl) or mCP(1,3-bis(carbazol-9-yl) and a dopant comprising any one or more selected from the group consisting of PIQIr (acac)(bis(1-phenylisoquinoline)acetylacetonate iridium), PQIr(acac)(bis(1-phenylquinoline)acetylacetonate iridium), PQIr(tris(1-phenylquinoline)iridium), and PtOEP(octaethylporphyrin platinum). Alternatively, it may be made of a fluorescent material comprising PBD:Eu(DBM)3(Phen) or Perylene, but not limited thereto.

If the second emission layer 142 is a green light emitting layer, it may be made of a phosphorescent material which comprises a host material comprising CBP or mCP and a dopant material comprising Ir(ppy)3(fac tris(2-phenylpyridine)iridium). Alternatively, it may be made of a fluorescent material comprising Alq3(tris(8-hydroxyquinolino)aluminum, but not limited thereto.

If the second emission layer 142 is a blue light emitting layer, it may be made of a phosphorescent material which comprises a host material comprising CBP or mCP and a dopant material comprising (4,6-F2 ppy)2Irpic. Alternatively, it may be made of a fluorescent material comprising at least one selected from the group consisting of spiro-DPVBi, spiro-6P, distyryl benzene (DSB), distyrylarylene (DSA), PFO series polymer, and PPV series polymer, but not limited thereto.

The above-described first emission layer 141 comprises the same host as the second emission layer 142, whose host is determined according to the light emission color of the second emission layer 142. This is to make it easy to transfer energy from the host to the dopant when light emission occurs in the second emission layer 142.

Meanwhile, in the present invention, the above-described hole function layer 130 may be obtained as the first emission layer 141 is melted by heat treatment.

When the hole function layer 130 directly contacting the first electrode 120 is melted, the interfacial characteristics between the first electrode 120 and the hole function layer 130 can be improved, and moisture contained in the hole function layer 130 can be eliminated.

Moreover, when the first emission layer 141 directly contacting the hole function layer 130 is melted, the interfacial characteristics between the hole function layer 130 and the first emission layer 141 can be improved, and moisture contained in the first emission layer 141 can be eliminated.

Accordingly, the present invention has the advantages of improving the characteristics of the interface between the first electrode 120 and the hole function layer 130 and the interface between the hole function layer 130 and the first emission layer 141 and eliminating moisture contained in the hole function layer 130 and the first emission layer 141, by melting the hole function layer 130 and the first emission layer 141.

The electron transportation layer 150 disposed on the second emission layer 142 facilitates transportation of electrons and can be made of one or more selected from a group of Alq3(tris(8-hydroxyquinolino)aluminum), PBD, TAZ, spiro-PBD, BAlq, and SAlq, which is not limited to the above.

The electron transportation layer 150 can prevent holes injected from the first electrode 120 from passing through the emission layer 140 to the second electrode 170. In other words, the electron transportation layer 135 performs the role of a hole blocking layer, facilitating efficient combination between holes and electrons in the emission layer.

The electron injection layer 160 disposed on the electron transportation layer 150 facilitates injection of electrons and can use Alq3(tris(8-hydroxyquinolino)aluminum), PBD, TAZ, spiro-PBD, BAlq, or SAlq, but is not limited to the above.

The electron injection layer can further comprise inorganic substance and the inorganic substance can further comprise metallic compound. The metallic compound can comprise alkali metal or alkali earth metal. Metallic compound comprising the alkali metal or alkali earth metal can be one or more selected from a group consisting of LiQ, LiF, NaF, KF, RbF, CsF, FrF, BeF2, MgF2, CaF2, SrF2, BaF2, and RaF2, but is not limited to the above.

The second electrode 170 disposed on the electron injection layer 160 can be made of magnesium (Mg), calcium (Ca), aluminum (Al), or silver (Ag) with a low work function, or an alloy of the above metal. At this point, the second electrode 170, if an organic light emitting device has a front emitting or a double-sided light emitting structure, can be formed with a thickness as thinly as light can penetrate; if the organic light emitting device is a backward emitting structure, the second electrode 170 can be formed as thickly as light can be reflected.

Accordingly, the organic light emitting device according to an exemplary embodiment of the present invention has the advantages of improving the characteristics of the interface between the first electrode and the hole function layer and the interface between the hole function layer and the first emission layer and eliminating moisture contained in the hole function layer and the first emission layer, by melting the hole function layer and the first emission layer.

Hereinafter, a method for manufacturing the organic light emitting device according to an exemplary embodiment of the present invention will be described.

Figure 2A:
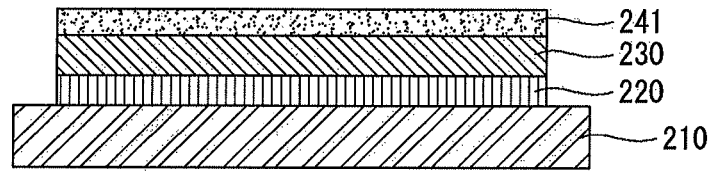
FIGS. 2A to 2C are views showing the respective steps in a manufacturing method of the organic light emitting device according to an exemplary embodiment of the present invention.
Figure 2B:
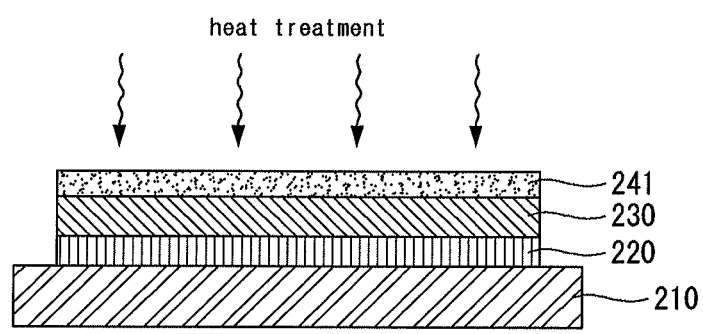
Figure 2C:
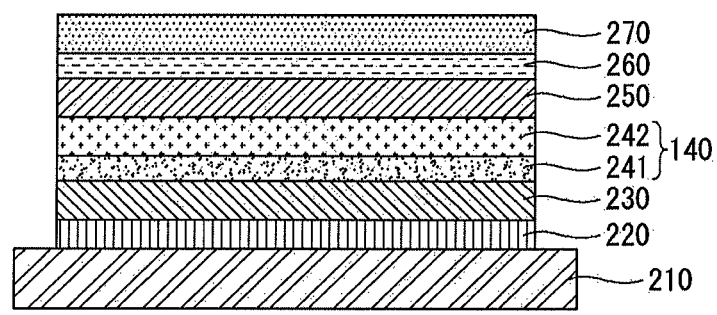

FIGS. 2A to 2C are views showing the respective steps in a manufacturing method of the organic light emitting device according to an exemplary embodiment of the present invention Referring to FIG. 2A, a first electrode 220 is formed on the substrate 210. The first substrate 220 can be formed by using sputtering, evaporation, vapor phase deposition, or electron beam deposition method.

Also, before forming the first electrode 220, a thin film transistor comprising a gate electrode, a semiconductor layer, a source electrode, and a drain electrode may be further formed on the substrate 210.

Next, a hole function layer 230 is formed on the first electrode 220. The hole function layer 230 may comprise at least one of a hole injection layer or hole transportation layer. The hole injection layer or the hole transportation layer may be formed by using evaporation or spin coating method; the thickness of the hole injection layer can range from about 5 nm to about 150 nm.

Next, a first emission layer 241 is formed on the hole function layer 230. The first emission layer 241 may be formed of the same material as the host material of the second emission layer 242 to be formed later, and can be formed by using evaporation or vapor deposition.

The first emission layer 241 may be formed at 1 to 20% the thickness of the second emission layer 242 to be formed later, and may be formed at a thickness of about 5 to about 100 nm. More preferably, the first emission layer 241 may be formed at a thickness of about 10 to about 35 nm.

If the thickness of the first emission layer 241 is formed at a thickness greater than about 1% the thickness of the second emission layer 242, the first emission layer 241 can be prevented from being damaged in a melting process. If the thickness of the first emission layer is formed at a thickness less than about 20% the thickness of the second emission layer 242, energy transfer to the dopant of the second emission layer 242 can easily occur.

Next, referring to FIG. 2B, the hole function layer 230 and the first emission layer 241 are melted by applying heat thereto. At this point, the melting temperature of the hole function layer 230 and the first emission layer 241 may be higher than the glass transmission temperature Tg of the hole function layer 230 and the first emission layer 241, more particularly, about 100 to about 250° C. Here, the melting indicates slight melting of the surfaces of the hole function layer 230 and the first emission layer 241, rather than complete phase transmission from solid to liquid.

When the hole function layer 230 is melted, the interfacial bonding force between the first electrode 220 and the hole function layer 230 can be improved, and accordingly the interface characteristics thereof can be improved. Also, as the hole function layer 230 is made of an organic substance, moisture contained the organic substance can be evaporated to the outside and eliminated.

Moreover, when the first emission layer 241 is melted, the interfacial bonding force between the hole function layer 230 and the first emission layer 241 can be improved, and accordingly the interface characteristics thereof can be improved. Also, as the first emission layer 241, too, is made of an organic substance, moisture contained the organic substance can be evaporated to the outside and eliminated.

Continuously, after the melting process, the second emission layer 242 is formed on the first emission layer 241. As described above, the second emission layer 242 may comprise a host and a dopant. The host of the second emission layer 242 may be formed of the same material as the host of the first emission layer 241. Also, the dopant contained in the host may be doped at a concentration of about 5 to about 35%.

The second emission layer 242 may be formed by evaporation or vapor deposition like the above-described first emission layer 241, and it may be formed by co-deposition of the host and the dopant.

In the present invention, the melting process is performed before the formation of the second emission layer 242 comprising the dopant. This is because the dopant is weak to heat, and therefore thermal denaturation of the dopant material occurs, thereby degrading the performance of the device.

Next, referring to FIG. 2C, an electron transportation layer 250 is formed on the second emission layer 242. The electron transporting layer 250 may be formed by using evaporation or spin coating, and the electron transporting layer 250 may be formed at a thickness of about 1 to about 50 nm.

Continuously, an electron injection layer 260 is formed on the electron transportation layer 260. The electron transportation layer 260 may be formed by using evaporation or spin coating, and the electron transportation layer 260 may be formed at a thickness of about 1 to about 50 nm. Next, a second electrode 270 is formed on the electron injection layer 260 to manufacture an organic light emitting device 200 according to an exemplary embodiment of the present invention.

Hereinafter, the organic light emitting device of the present invention will be described in detail in the following exemplary embodiment. It is to be noted that the disclosed embodiment is only illustrative and this invention is not limited to the following embodiment.

Embodiment

The OLED was fabricated as follows. A light emitting area with 3 mm by 3 mm in size was patterned and cleaned on a glass substrate. The anode of ITO was formed on the substrate at a thickness of 500 Å, and the hole transportation layer of NPD was formed at a thickness of 70 nm, and the host of CBP as the first emission layer was formed at a thickness of 5 nm. After that, the substrate was heat-treated for 20 mins at 100° C. under N2 atmospheric pressure, thereby melting the hole transportation layer and the first emission layer.

Thereafter, in the deposition chamber, the host of CBP and the dopant of Ir(PPY)3 (doping concentration of 4%) were formed as a second emission layer at a thickness of 30 nm. Next, the electron transportation layer of spiro-PBD was formed at a thickness of 30 nm, the electron injection layer of LiF was formed at a thickness of 1 nm, and the second electrode of Al was formed at a thickness of 100 nm, thereby fabricating an organic light emitting device.

Comparative Example 1

The first emission layer was not formed, and the heat treatment process was not performed. As for the other processes, an organic light emitting device was fabricated under the same condition as the above-described Embodiment.

Comparative Example 2

The first emission layer was not formed. As for the other processes, an organic light emitting device was fabricated under the same condition as the above-described Embodiment.

Comparative Example 3

The first emission layer was not formed, and the heat treatment process was performed after forming the second emission layer. As for the other processes, an organic light emitting device was fabricated under the same condition as the above-described Embodiment.

The driving voltage, luminous efficiency, color coordinates, and lifespan of the organic light emitting devices fabricated according to the Embodiment and Comparative Examples 1 to 3 were measured and shown in the following Table 1.

TABLE 1

| | Driving voltage | Luminous efficiency | | Color coordinates | | Lifespan |
|---|---|---|---|---|---|---|
| | (V) | Cd/A | 1m/W | CIE_x | CIE_y | ($T_{50}$) |
| Comparative Example 1 | 3.85 | 3.96 | 3.23 | 0.140 | 0.064 | 1,560 hr |
| Comparative Example 2 | 3.96 | 3.99 | 3.4 | 0.146 | 0.065 | 2.050 hr |
| Comparative Example 3 | 3.67 | 2.45 | 2.09 | 0.151 | 0.073 | 950 hr |
| Embodiment | 3.82 | 3.93 | 3.23 | 0.145 | 0.064 | 2,430 hr |

Referring to Table 1, it can be seen that the lifespan of the organic light emitting device according to Embodiment was improved by about 900 hrs compared to Comparative Example 1 in which heat treatment was performed without forming the first emission layer.

Also, it can be seen that the lifespan of the organic light emitting device according to Embodiment was improved by about 380 hrs compared to Comparative Example 2 in which heat treatment was performed without forming the first emission layer.

Also, it can be seen that the lifespan of the organic light emitting device according to Embodiment was improved by about 1480 hrs compared to Comparative Example 3 in which heat treatment was performed after forming the second emission layer without forming the first emission layer. In particular, it can be seen that the lifespan characteristics of the device of Comparative Example 3 was lowered due to thermal denaturation of the dopant material in the heat treatment process.

As described above, the organic light emitting device of the present invention has the advantages of improving the characteristics of the interface between the first electrode and the hole function layer and the interface between the hole function layer and the first emission layer and eliminating moisture contained in the hole function layer and the first emission layer, by melting the hole function layer and the first emission layer. Accordingly, the lifespan of the organic light emitting device can be improved.

It can be seen that, although the driving voltage of the organic light emitting device fabricated according to Embodiment is slightly increased compared to Comparative Examples, the luminous efficiency, quantum efficiency, brightness, and color coordinate characteristics thereof are excellent.

Moreover, referring to FIG. 3, it can be seen that the lifespan characteristics of the organic light emitting device fabricated according to Embodiment are much higher compared to Comparative Examples.

In other words, the organic light emitting device according the exemplary embodiments of the present invention can improve the lifespan and efficiency of the organic light emitting device due to direct transition of excitons from the buffer layer to the dopant of the emission layer by including the buffer layer between the emission layer and the electron transportation layer. Also, the injection of electrons to the emission layer was restricted by an energy barrier between the emission layer and the buffer layer, and this causes a light emitting area in the emission layer to be moved toward the electron transportation layer, thereby improving the lifespan and efficiency of the organic light emitting device.

Therefore, there is an advantage in that it is possible to improve the luminous efficiency, quantum efficiency, brightness, and color coordinate characteristics of the organic light emitting device, and in turn to provide the organic light emitting device with a high reliability.

The foregoing embodiments and advantages are merely exemplary and are not to be construed as limiting the present invention. The present teaching can be readily applied to other types of apparatuses. The description of the foregoing embodiments is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures. Moreover, unless the term "means" is explicitly recited in a limitation of the claims, such limitation is not intended to be interpreted under 35 USC 112(6).

What is claimed is:

1. A method for manufacturing an organic light emitting device, the method comprising:
    forming a first electrode disposed on a substrate;
    forming a hole function layer on the first electrode;
    forming a first emission layer on and in direct contact with the hole function layer;
    performing a heat treatment process to melt surfaces of the hole function layer and the first emission layer;
    forming a second emission layer on the first emission layer;
    forming an electron function layer on the second emission layer, the second emission layer being in direct contact with the first emission layer and the electron function layer; and
    forming a second electrode on the electron function layer,
    wherein the first emission layer includes a host alone and the second emission layer includes a dopant and a host, the melting process is performed before the formation of the second emission layer comprising the dopant, and
    wherein the first emission layer is thinner than the second emission layer and has a thickness at 1 to 20% of the second emission layer.

2. The method of claim 1, wherein the melting of the hole function layer and the first emission layer is performed at a temperature of 100 to 250° C.

3. The method of claim 1, wherein the first emission layer is formed at a thickness of 5 to 100 nm.

4. The method of claim 1, wherein the heat treatment process is performed for 20 minutes at 100° C. under $N_2$ atmosphere pressure.

* * * * *